(12) United States Patent
Lee et al.

(10) Patent No.: US 12,046,606 B2
(45) Date of Patent: Jul. 23, 2024

(54) IMAGE SENSING DEVICE WITH GATE DIELECTRIC PORTION VARYING THICKNESS THAT INCREASES ALONG MIGRATION PATH OF PHOTOCHARGES

(71) Applicant: SK hynix Inc., Icheon-si (KR)

(72) Inventors: Ho Ryeong Lee, Icheon-si (KR); Kyoung In Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 414 days.

(21) Appl. No.: 17/537,946

(22) Filed: Nov. 30, 2021

(65) Prior Publication Data

US 2022/0262836 A1 Aug. 18, 2022

(30) Foreign Application Priority Data

Feb. 16, 2021 (KR) ........................ 10-2021-0020218

(51) Int. Cl.
*H01L 27/146* (2006.01)
*H04N 25/77* (2023.01)
*H04N 25/63* (2023.01)
*H04N 25/75* (2023.01)

(52) U.S. Cl.
CPC ....... *H01L 27/14614* (2013.01); *H04N 25/77* (2023.01); *H04N 25/63* (2023.01); *H04N 25/75* (2023.01)

(58) Field of Classification Search
CPC ......... H01L 27/14614; H01L 27/14616; H01L 27/14643; H01L 27/14607; H04N 25/63
See application file for complete search history.

(56) References Cited

U.S. PATENT DOCUMENTS

| | | | | |
|---|---|---|---|---|
| 2009/0236498 A1* | 9/2009 | Nagaraja | ........... | H01L 29/42368 257/E31.083 |
| 2010/0110258 A1* | 5/2010 | Mheen | ................... | H04N 25/63 348/308 |
| 2015/0001637 A1* | 1/2015 | Cheng | ................. | H01L 29/7833 257/408 |

FOREIGN PATENT DOCUMENTS

| KR | 100789575 B1 * | 12/2007 | ....... H01L 27/14689 |
|---|---|---|---|
| KR | 100789575 B1 | 12/2007 | |
| KR | 100877691 B1 | 1/2009 | |

* cited by examiner

*Primary Examiner* — Moazzam Hossain
(74) *Attorney, Agent, or Firm* — Perkins Coie LLP

(57) ABSTRACT

An image sensing device is provided to include: a substrate including a photoelectric conversion layer configured to generate photocharges corresponding to the intensity of incident light; a plurality of doping regions disposed along a migration path of the photocharges and doped with dopants in different doping concentrations; and a gate dielectric layer disposed over the substrate and having a gate dielectric layer portion overlapping the plurality of doping regions, the gate dielectric layer portion having a varying thickness that increases along the migration path of the photocharges.

20 Claims, 6 Drawing Sheets

IMAGE SENSING DEVICE WITH GATE DIELECTRIC PORTION VARYING THICKNESS THAT INCREASES ALONG MIGRATION PATH OF PHOTOCHARGES

CROSS-REFERENCES TO RELATED APPLICATION

This patent document claims the priority and benefits of Korean application number 10-2021-0020218, filed on Feb. 16, 2021, in the Korean Intellectual Property Office, which is incorporated herein by reference in its entirety.

TECHNICAL FIELD

The technology and implementations disclosed in this patent document generally relate to an image sensing device including a pixel which includes a transistor configured to transfer photocharges to a sensing node.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology are directed to an image sensing device having an enhanced photocharge transfer characteristic.

In one aspect, an image sensing device is provided to include: a substrate comprising a photoelectric conversion layer configured to generate photocharges corresponding to the intensity of incident light; a plurality of doping regions disposed along a migration path of the photocharges; and a gate dielectric layer having a thickness that increases in a stepwise manner along the migration path in a region overlapping the plurality of doping regions.

In another aspect, an image sensing device is provided to include: a first region disposed in a substrate and configured to generate photocharges in response to incident light; a second region and a third region that are disposed along a migration path of the photocharges and have doping concentrations that decrease along the migration path of the photocharges; a fourth region disposed to accumulate the photocharges transferred through the second region and the third region; and a gate dielectric layer having a portion overlapping with the second region and the third region, the portion of the gate dielectric layer having a thickness that increases along the migration path of the photocharges.

In accordance with embodiments of the disclosed technology, the thickness of the gate dielectric layer may be adjusted in the migration direction of photocharges, which makes it possible to reduce a dark current and to improve the photocharge transfer efficiency.

In addition, it is possible to provide various effects which are directly or indirectly understood through this document.

DETAILED DESCRIPTION

Figure 1:
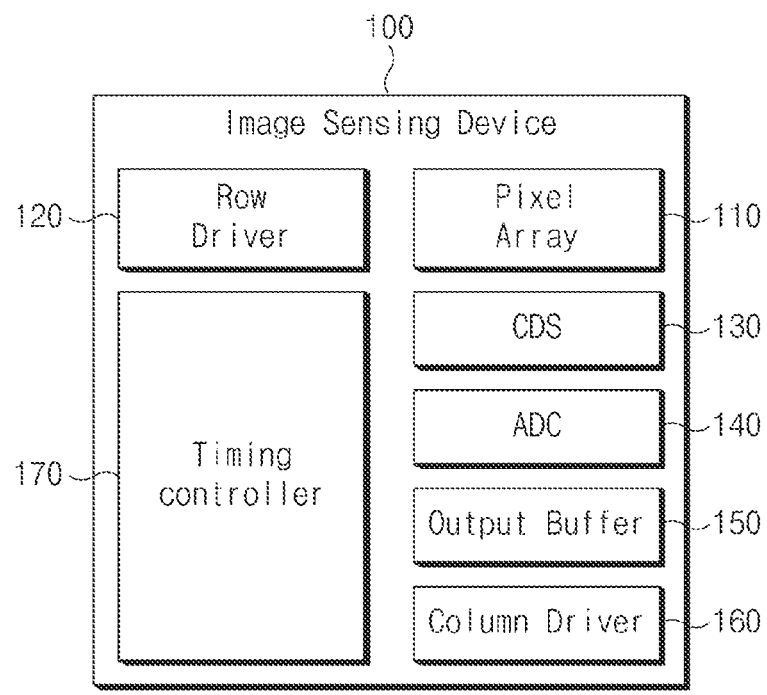
FIG. 1 is a block diagram illustrating an image sensing device in accordance with an embodiment of the disclosed technology.

This patent document provides implementations and examples of an image sensing device including pixels capable of adjusting sensitivity that substantially addresses one or more issues due to limitations and disadvantages of the related art. Some implementations of the disclosed technology relate to the image sensing device in which pixels capable of adjusting sensitivity are efficiently arranged. The disclosed technology provides various implementations of an image sensing device which can acquire capacitance required for a low sensitivity mode by changing a layout structure of pixels, without increasing the size of each pixel or without using a capacitor having a possibility of noise occurrence.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

FIG. 1 is a block diagram illustrating an image sensing device 100 according to an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160 and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit imaging pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding unit imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the output buffer 150 output the image data provided to the output buffer 150 from the ADC 140 and stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the CDS 130, the ADC 140, the output buffer 150, and the column driver 160 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
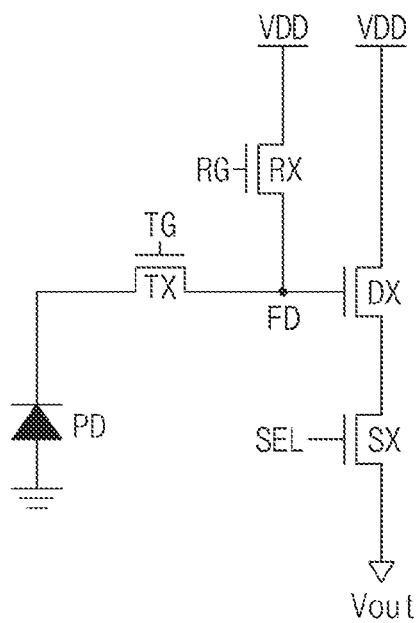
FIG. 2 is a diagram illustrating an embodiment of a pixel included in the pixel array illustrated in FIG. 1.

FIG. 2 is a diagram illustrating an embodiment of a pixel included in the pixel array illustrated in FIG. 1.

Referring to FIG. 2, a pixel 200 corresponds to one implementation of a unit pixel included in the pixel array 110 of FIG. 1, and may convert the intensity of incident light into an electrical signal. The pixel 200 may be a color sensing pixel configured to convert the intensity of incident light, corresponding to a specific wavelength band (for example, red, blue or green), into an electrical signal, or a distance sensing pixel configured to convert the intensity of modulated light, reflected and incident from a target object, into an electrical signal. In this implementation, the pixel 200 corresponds to a color sensing pixel having a 4-TR (transistor) structure. However, other implementations are also possible and the disclosed technology can be applied to various pixels each including a transmission transistor configured to transmit photocharges, generated from a photoelectrical conversion element in response to the intensity of light, to a floating diffusion region.

The pixel 200 may include a photoelectric conversion element PD, a transmission transistor TX, a floating diffusion region FD, a reset transistor RX, a drive transistor DX and a selection transistor SX.

The photoelectric conversion element PD may be connected between a ground terminal and the transmission transistor TX, and generate and accumulate photocharges corresponding to the intensity of incident light according to the photoelectric effect. The ground terminal may be a terminal configured to supply a ground voltage. The photoelectric conversion element PD may be implemented as a photo diode, a photo transistor, a photo gate, a pinned photo diode or combinations thereof. In FIG. 2, a photo diode is exemplified as the photoelectric conversion element PD. The photocharges accumulated by the photoelectric conversion element PD may be transmitted to the floating diffusion region FD through the transmission transistor TX.

The transmission transistor TX may be connected between the photoelectric conversion element PD and the floating diffusion region FD, and turned on according to a transmission signal TG applied to a gate thereof. When the transmission signal TG has an active voltage (or logic high level), the transmission transistor TX may be turned on to transmit the photocharges, accumulated in the photoelectric conversion element PD, to the floating diffusion region FD. When the transmission signal TG has an inactive voltage (or logic low level), the transmission transistor TX may be turned off not to transmit the photocharges, accumulated in the photoelectric conversion element PD, to the floating diffusion region FD.

The floating diffusion region FD may be configured to store photocharges such that the photocharge can be converted into a voltage. The floating diffusion region FD may be implemented as a junction capacitor. For example, the floating diffusion region FD may be doped with a second conductive-type (for example, n-type) impurity within a substrate having a first conductive type (for example, p-type).

The reset transistor RX may be connected between a supply voltage VDD and the floating diffusion region FD, and turned on according to a pixel reset signal RG applied to a gate thereof. The supply voltage VDD may indicate a predetermined voltage (for example, 2.5 V) supplied to the pixel array 110. When the pixel reset signal RG has an active voltage (or logic high level), the reset transistor RX may be turned on to drain the photocharges accumulated in the floating diffusion region FD as the supply voltage VDD, thereby resetting the floating diffusion region FD to the supply voltage VDD. When the pixel reset signal RG has an inactive voltage (or logic low level), the reset transistor RX may be turned off to electrically isolate the floating diffusion region FD from the supply voltage VDD.

The drive transistor DX may be coupled between the supply voltage VDD and the selection transistor SX, and have a gate coupled to the floating diffusion region FD. Thus, the drive transistor DX may transfer an electrical signal, corresponding to the electrical potential of the floating diffusion region FD, to the selection transistor SX.

The selection transistor SX may perform a function of selecting a pixel to be read in row units of the pixel array 110. The selection transistor SX may be turned on according to a row selection signal SEL applied to a gate thereof, and output the electrical signal as an output voltage Vout, the electrical signal being supplied from the drive transistor DX and corresponding to the electrical potential of the floating diffusion region FD.

The pixel 200 may operate in a plurality of operation periods. In an embodiment, the plurality of operation periods may include a reset period, a first readout period, a photocharge accumulation period, a photocharge transmission period and a second readout period. The plurality of operation periods may be sequentially processed, or at least some of the operation periods may be processed in parallel at the same time. In some implementations, the plurality of operation periods can be modified in various manners.

The reset period may indicate a period in which the floating diffusion region FD is reset to the supply voltage VDD. During the reset period, the reset transistor RX may be turned on to reset the floating diffusion region FD to the supply voltage VDD. At this time, the transmission transistor TX may also be turned on to transfer the photocharges, accumulated in the photoelectric conversion element PD, to the floating diffusion region FD, thereby draining the photocharges.

The first readout period may indicate a period in which the electrical signal corresponding to the electrical potential of the reset floating diffusion region FD is outputted as the output voltage Vout. That is, the first readout period may be conducted immediately after the reset period. During the first readout period, the selection transistor SX may be turned on. The output voltage Vout outputted in the first readout period may indicate the reference signal described with reference to FIG. 1.

The photocharge accumulation period may indicate a period in which the photoelectric conversion element PD generates and accumulates photocharges in response to the intensity of incident light. During the photocharge accumulation period, the transmission transistor TX may be turned off so that the photocharges generated by the photoelectric conversion element PD are accumulated in the photoelectric conversion element PD.

The photocharge transmission period may indicate a period in which the photocharges accumulated in the photoelectric conversion element PD are transmitted to the floating diffusion region FD through the transmission transistor TX. During the photocharge transmission period, the reset transistor RX may be turned off, and the transmission transistor TX may be turned on, so that the photocharges accumulated in the photoelectric conversion element PD are migrated to and accumulated in the floating diffusion region FD.

The second readout period may indicate a period in which the electrical signal corresponding to the electrical potential of the floating diffusion region FD having the photocharges accumulated therein is outputted as the output voltage Vout. That is, the second readout period may be performed immediately after the photocharge transmission period. During the second readout period, the selection transistor SX may be turned on. The output voltage Vout outputted in the second readout period may indicate the image signal described with reference to FIG. 1.

Figure 3:
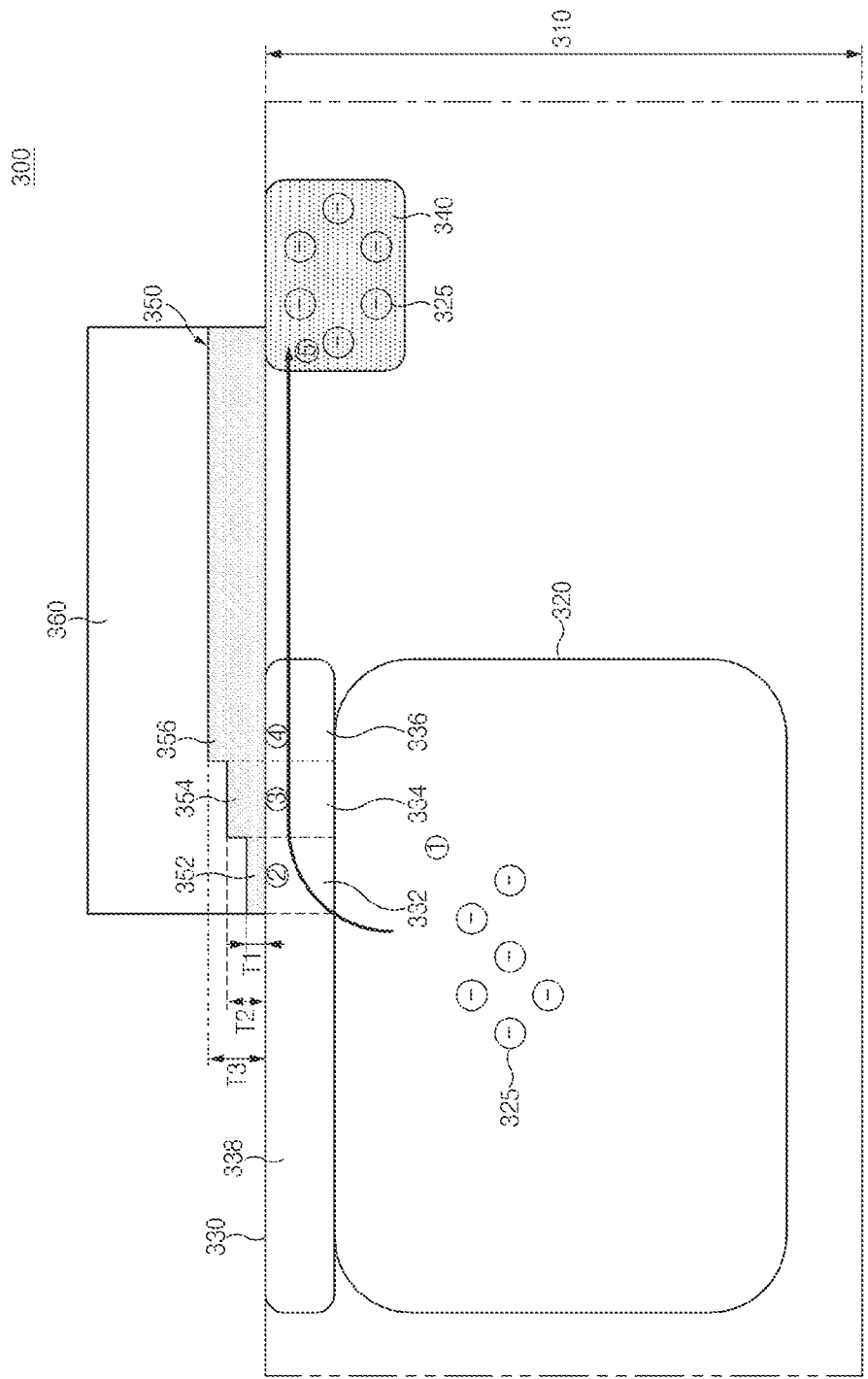
FIG. 3 is a diagram illustrating an embodiment of a cross-section of the pixel illustrated in FIG. 2.

FIG. 3 is a diagram illustrating an embodiment of a cross-section of the pixel illustrated in FIG. 2.

FIG. 3 illustrates a cross-section 300 of an image sensing device including the photoelectric conversion element PD, the transmission transistor TX and the floating diffusion region FD, which are shown in FIG. 2.

Referring to the cross-section 300, the image sensing device may include a substrate 310, a photoelectric conversion layer 320, a pinning layer 330, a floating diffusion region 340, a gate dielectric layer 350 and a gate electrode 360. The photoelectric conversion layer 320 and the pinning layer 330 may correspond to the photoelectric conversion element PD, the floating diffusion region 340 may correspond to the floating diffusion region FD, and the gate dielectric layer 350 and the gate electrode 360 may correspond to the gate of the transmission transistor TX. The gate dielectric layer 350 and the gate electrode 360 may be formed or disposed in a wiring layer over the substrate 310. The pinning layer 330 and the floating diffusion region 340 may correspond to both ends of the transmission transistor TX, respectively.

The substrate 310 may have a front side and a back side. The top side of the substrate 310 illustrated in FIG. 3 may indicate the front side, and the bottom side of the substrate 310 may indicate the back side. The pixel 200 may have a back-side illumination structure to receive incident light through the back side or a front side illumination structure to receive incident light through the front side.

The substrate 310 may be formed as a p-substrate or a p-epitaxial layer obtained by epitaxially growing a p-type impurity in a p-substrate, and include the photoelectric conversion layer 320, the pinning layer 330 and the floating diffusion region 340, which are impurity layers doped in the substrate 310.

The photoelectric conversion layer 320 may absorb incident light, and generate and accumulate photocharges 325 corresponding to the intensity of incident light. The photoelectric conversion layer 320 may be or include a region doped with an n-type impurity.

The pinning layer 330 may be or include a region doped with a p-type impurity having a higher concentration than the substrate 310 along a surface (for example, front side) of the substrate 310, and serve to suppress the generation of dark current. The pinning layer 330 may be formed between the surface of the substrate 310 and the photoelectric conversion layer 320. In some implementations, the pinning layer 330 has substantially the same width as the photoelectric conversion layer 320. In some implementations, the pinning layer 330 has substantially the area corresponding to the photoelectric conversion layer 320. In some implementations, any one of the photoelectric conversion layer 320 and the pinning layer 330 may have a larger width than the other. At least a part of the pinning layer 330 may overlap the gate dielectric layer 350 and the gate electrode 360 that form the transmission transistor TX.

A dark current, which is a flow of defect electrons generated by an etching process, may flow at the surface of the substrate 310, thereby generating unintended noise. When the pinning layer 330 is not formed and the photoelectric conversion layer 320 abuts on the surface of the substrate 310 or is formed close to the surface of the substrate 310, the photocharges 325 of the photoelectric conversion layer 320 may contribute to the dark current, thereby generating noise in the pixel signal. In particular, such noise may dominantly act on the pixel signal under a low luminance condition in which the luminous intensity of incident light is relatively low.

With the pinning layer 330 formed at the surface of the substrate 310, holes of the pinning layer 330 can suppress a flow of defect electrons, thereby reducing a dark current. The increase in doping concentration of the pinning layer 330 may improve the dark current reduction effect. However, if the pinning layer 330 is doped to too high level and a difference in doping concentrations between the pinning layer 330 and the region where the channel of the transmission transistor TX is formed (i.e. the region between the pinning layer 330 and the floating diffusion region 340) significantly increase, the efficiency that the photocharges 325 of the photoelectric conversion layer 320 are transferred to the channel of the transmission transistor TX through the pinning layer 330 may be reduced to degrade the lag characteristic of the transmission transistor TX.

Therefore, in implementations of the disclosed technology, the pinning layer 330 may be divided into first to fourth doping regions 332, 334, 336 and 338. The first to third doping regions 332, 334 and 336 may overlap the gate dielectric layer 350, and the fourth doping region 338 may not overlap the gate dielectric layer 350.

Among the first to fourth doping regions 332, 334, 336 and 338, the fourth doping region 338 may have the highest impurity doping concentration, and the impurity doping concentration may decrease from the first doping region 332 toward the third doping region 336. In some implementations, the impurity doping concentration may decrease in a stepwise manner from the first doping region 332 toward the third doping region 336. The third doping region 336 may have a higher doping concentration than the substrate 310. When the transmission transistor TX is turned on, the photocharges 325 of the photoelectric conversion layer 320 may be transferred to the floating diffusion region 340 through a migration path illustrated in FIG. 3. Thus, the photocharges 325 may migrate through an internal region of the pinning layer 330, which overlaps the gate electrode 360 of the transmission transistor TX. As the first to third doping regions 332, 334 and 336 arranged along the migration path have doping concentrations that decrease, for example, in a stepwise manner, the lag characteristic of the transmission transistor TX can be improved. Furthermore, the fourth doping region 338 which is disposed away from the migration path of the photocharges 325 may have the highest doping concentration, thereby further improving the dark current reduction effect of the pinning layer 330.

FIG. 3 illustrates the embodiment in which the pinning layer 330 is formed as four regions having different doping concentrations. However, the number of regions of the pinning layer 330 that have different doping concentrations is not limited to four and other implementations are also possible. Thus, the pinning layer 330 may include N number of regions having different doping concentrations, whereby N is a positive integer other than 4.

The floating diffusion region 340 may be formed in the substrate 310 including a first conductive-type (p-type) impurity and doped with a second conductive-type (n-type) impurity. The floating diffusion region 340 may have a junction capacitor in the relationship with the substrate 310, and accumulate the photocharges 325 transferred through the channel of the transmission transistor TX. At least a part of the floating diffusion region 340 may overlap each of the gate dielectric layer 350 and the gate electrode 360 that form the transmission transistor TX.

The gate dielectric layer 350 may electrically isolate the gate electrode 360 abutting on the gate dielectric layer 350 from the substrate 310, the pinning layer 330 and the floating diffusion region 340. In some implementations, the gate dielectric layer 350 may be or include an oxide layer. In some implementations, the gate dielectric layer 350 may be implanted using other dielectric materials than the oxide layer.

One side of the gate dielectric layer 350 may overlap the floating diffusion region 340, and the other side of the gate dielectric layer 350 may overlap the pinning layer 330.

The gate dielectric layer 350 may include first to third dielectric regions 352, 354 and 356 having different thicknesses. In some implementations, the gate dielectric layer 350 may have a thickness that increases along the migration path of the photocharges 325. In some implementations, the thickness of the gate dielectric layer may increase in a stepwise manner but other implementations are also possible. In the implementation as shown in FIG. 3, the first to third dielectric regions 352, 354 and 356 and the floating diffusion region 340 may be disposed in a direction parallel to a surface of the substrate 310.

The first dielectric region 352 may overlap the first doping region 332, and have a first thickness T1. The second dielectric region 354 may overlap the second doping region 334, and have a second thickness T2 larger than the first thickness T1. The third dielectric region 356 may overlap the third doping region 336, the substrate 310 and the floating diffusion region 340, and have a third thickness T3 larger than the second thickness T2.

The gate electrode 360 may be disposed over the first to third dielectric regions 352, 354 and 356, and configured to receive one transmission signal TG. Since the first to third dielectric regions 352, 354 and 356 have different thicknesses from one another, the transmission signal TG applied to the gate electrode 360 affect the pinning of the photocharges at different levels as discussed below.

In the photocharge accumulation period, the gate electrode 360 may receive the transmission signal TG having a first voltage. The first voltage may correspond to an inactive voltage that turns off the transmission transistor TX. For example, the first voltage may be a negative voltage. In an embodiment, an inactive voltage for the transmission signal TG in periods other than the photocharge accumulation period may be a ground voltage.

When the first voltage is applied to the gate electrode 360, holes within the pinning layer 330 may be accumulated (or pinned) around the boundary between the pinning layer 330 and the gate dielectric layer 350, thereby reducing a dark current. Since the doping concentration is increased from the third doping region 336 toward the first doping region 332, the quantity of holes increases from the first doping region 332 to the third doping region 336. The thickness of the gate dielectric layer 350 decreases from the third dielectric region 356 toward the first dielectric region 352 and thus, the voltage applied to the gate electrode 360 strongly acts on the first doping region 332 as compared to the third doping region 336. With the voltage more strongly acting on the first doping region 332 in which more holes exist than the second and third doping regions 334 and 336 in which relatively less holes exist, the holes of the first to third doping regions 332, 334 and 336 can be effectively pinned. If the gate dielectric layer 350 has a single thickness (for example, T3), holes may not be effectively pinned in a region including a relatively large quantity of holes (for example, the region corresponding to the first doping region 332), which may result in generating a dark current.

In some implementations, a microlens (not illustrated) may be disposed under the photoelectric conversion layer 320 so as to concentrate incident light toward the center of the photoelectric conversion layer 320. Due to the microlens, the photocharges 325 may be concentrated around the center of the photoelectric conversion layer 320. By reducing the thickness of the gate dielectric layer 350 from the third dielectric region 356 toward the first dielectric region 352 which is relatively close to the center of the photoelectric conversion layer 320, holes can be effectively pinned in the first doping region 332, which is relatively close to the center of the photoelectric conversion layer 320, by the gate electrode 360.

Thus, the generation of dark current by the photocharges 325 concentrated around the center of the photoelectric conversion layer 320 may be reduced.

In the photocharge transmission period, the gate electrode 360 may receive the transmission signal TG having a second voltage. The second voltage may correspond to an active voltage that turns on the transmission transistor TX. For example, the second voltage may be a positive voltage.

When the second voltage is applied to the gate electrode 360, the photocharges 325 accumulated in the photoelectric conversion layer 320 may be drawn upward to the pinning layer 330 and pass through the pinning layer 330. Then, the photocharges 325 may migrate to the floating diffusion region 340 through the channel of the transmission transistor TX formed between the pinning layer 330 and the floating diffusion region 340 under the gate dielectric layer 350.

As described above, the photocharges 325 may be intensively accumulated around the center of the photoelectric conversion layer 320 due to the microlens. The thickness of the gate dielectric layer 350 may be reduced from the third dielectric region 356 toward the first dielectric region 352 which is relatively close to the center of the photoelectric conversion layer 320, such that the photocharges 325 concentrated on the center of the photoelectric conversion layer 320 by the gate electrode 360 are effectively drawn upward toward the pinning layer 330.

As described above, the first to third doping regions 332, 334 and 336 may have doping concentrations that decrease, for example, in a stepwise manner, in order to improve the lag characteristic of the transmission transistor TX. Thus, the first to third doping regions 332, 334 and 336 may have potentials that decrease, for example, in a stepwise manner. The first doping region 332 having a relatively high doping concentration may have a higher potential than the photoelectric conversion layer 320, thereby forming a potential pocket to interrupt smooth migration of the photocharges 325 from the photoelectric conversion layer 320 to the first doping region 332. In accordance with an embodiment, however, the first dielectric region 352 having the first thickness T1 smaller than the third thickness T3 may be disposed over the first doping region 332, such that the influence of the voltage of the gate electrode 360 is increased. Thus, the potential of the first doping region 332 may be lowered to remove the potential pocket. Furthermore, in order to prevent a potential pocket from being formed between the second doping region 334 and the first doping region 332 having a potential lowered by the first dielectric region 352 having the first thickness T1, the second dielectric region 354 having the second thickness T2 smaller than the third thickness T3 may be disposed over the second doping region 334, thereby lowering the potential of the second doping region 334. Furthermore, the second thickness T2 may be set to a larger value than the first thickness T1, such that no potential pocket is formed between the third doping region 336 and the second doping region 334 having a potential lowered by the second dielectric region 354 having the second thickness T2. Thus, the first to third thicknesses T1 to T3 may be experimentally decided not to degrade the lag characteristic of the transmission transistor TX while preventing a potential pocket from being formed in the migration path of the photocharges 325.

In accordance with an embodiment, the pinning layer overlapping the gate of the transmission transistor TX may be formed to have a doping concentration that decreases, for example, in a stepwise manner, toward the floating diffusion region 340, and the gate dielectric layer whose thickness is increased, for example, in a stepwise manner, toward the floating diffusion region 340 so as to correspond to the concentration of the pinning layer may be disposed to reduce a dark current and to improve the photocharge transmission efficiency.

The gate electrode 360 may receive the transmission signal TG, and control the potential of the lower region of the gate dielectric layer 350. In some implementations, the gate electrode 360 may be a polysilicon electrode or metal electrode. Other implementations are also possible and thus the gate electrode 360 can be implemented in various manners.

Figure 4:
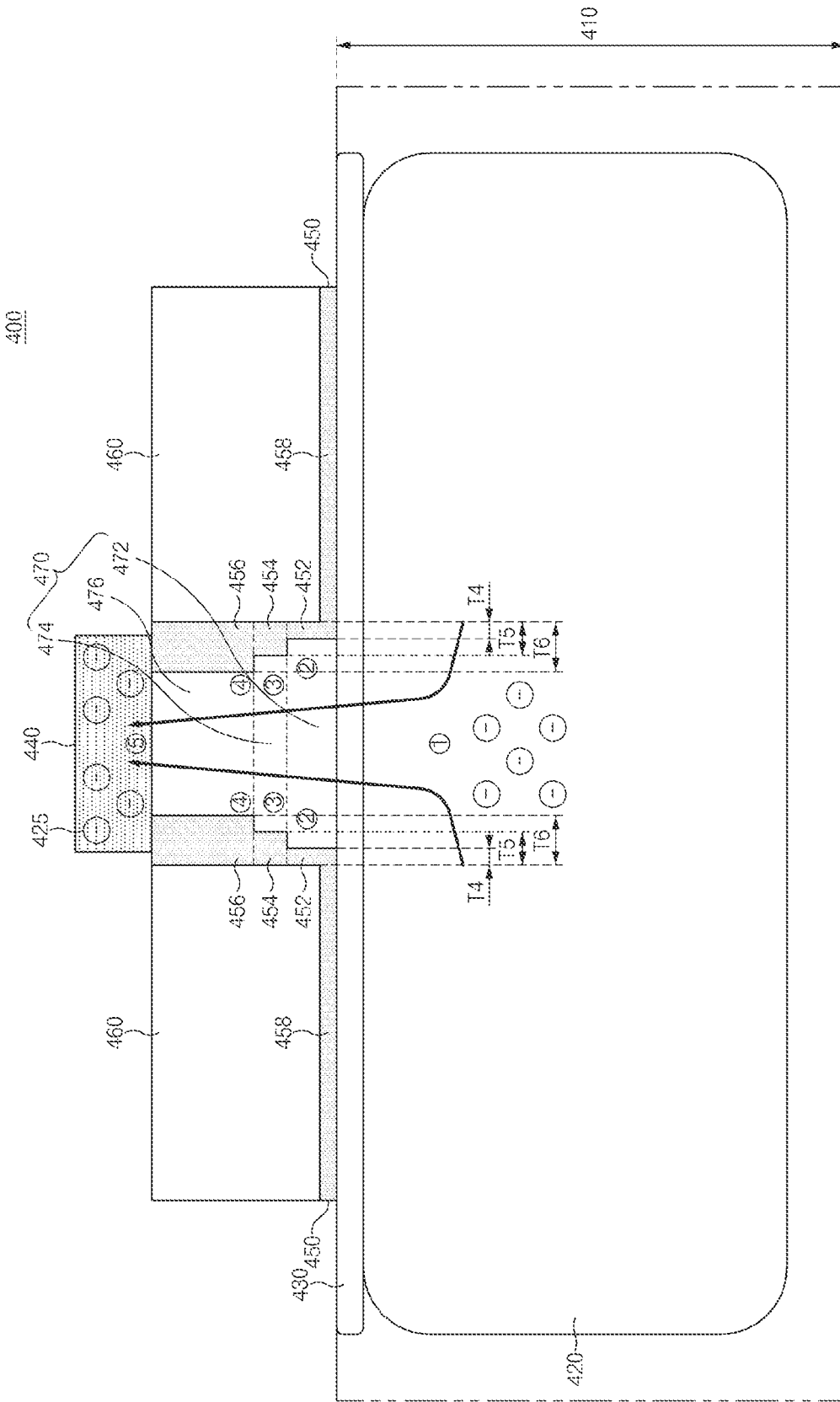
FIG. 4 is a diagram illustrating another embodiment of the cross-section of the pixel illustrated in FIG. 2.

FIG. 4 is a diagram illustrating another embodiment of the cross-section of the pixel illustrated in FIG. 2.

FIG. 4 illustrates a cross-section 400 of the image sensing device that includes the photoelectric conversion element PD, the transmission transistor TX and the floating diffusion region FD, which are shown in FIG. 2.

Referring to the cross-section 400, the image sensing device may include a substrate 410, a photoelectric conversion layer 420, a pinning layer 430, a floating diffusion region 440, a gate dielectric layer 450, a gate electrode 460 and a silicon region 470. The photoelectric conversion layer 420 and the pinning layer 430 may correspond to the photoelectric conversion element PD, the floating diffusion region 440 may correspond to the floating diffusion region FD, and the gate dielectric layer 450 and the gate electrode 460 may correspond to the gate of the transmission transistor TX. The pinning layer 430 and the floating diffusion region 440 may correspond to both ends of the transmission transistor TX, respectively.

The floating diffusion region 440, the gate dielectric layer 450, the gate electrode 460 and the silicon region 470 may be formed or disposed in a wiring layer over the substrate 410.

Since the functions, structures and materials of the substrate 410, the photoelectric conversion layer 420, the pinning layer 430, the floating diffusion region 440, the gate dielectric layer 450 and the gate electrode 460 are similar to those of the substrate 310, the photoelectric conversion layer 320, the pinning layer 330, the floating diffusion region 340, the gate dielectric layer 350 and the gate electrode 360, which have been described with reference to FIG. 3, the following descriptions will be focused on differences thereamong.

In the cross-section 400, the floating diffusion region 440 may not be formed in the substrate 410, but be formed over the substrate 410 so as to be spaced apart from the substrate 410. In this implementation, since the floating diffusion region 440 and the channel of the transmission transistor TX are disposed over the substrate 410 instead of being in the substrate 410, the photoelectric conversion layer 420 can occupy a greater area, which makes it possible to improve the photoelectric conversion efficiency.

The pinning layer 430 may be formed across an area between one surface of the substrate 410 and the photoelectric conversion layer 420. The size (or area) of the pinning layer 430 may correspond to that of the photoelectric conversion layer 420. In some implementation, the pinning layer 430 may have a constant doping concentration unlike the pinning layer 330 of FIG. 3. In some implementations, the pinning layer 430 can have different portions having different doping concentrations. For example, the pinning layer 430 may include a first impurity region formed under the bottom of the silicon region 470 and having a first doping concentration and a second impurity region not overlapping with the the silicon region 470 and having a second doping concentration different from the first doping concentration. In some implementations, the first doping concentration can be lower than the second doping concentration. In some implementations, the second impurity region can be disposed near the edge of the silicon region 470 or other positions. With the pinning layer 430 having different doping concentrations, the degradation of the lag characteristics of the transmission transistor TX can be prevented.

The floating diffusion region 440 may be formed over the substrate 410 so as to be spaced by a predetermined distance apart from the substrate 410. The floating diffusion region 440 may be disposed to overlap the center axis of the photoelectric conversion layer 420 or the optical axis of a microlens (not illustrated) to concentrate incident light on the photoelectric conversion layer 420. This is in order to raise the photocharge transmission efficiency by disposing the floating diffusion region 440 near the region on which photocharges 425 are concentrated, because the photocharges 425 are concentrated on the center of the photoelectric conversion layer 420.

Between the pinning layer 430 formed in the substrate 410 and the floating diffusion region 440 formed over the substrate 410, the silicon region 470 may be disposed.

The silicon region 470 may form a channel according to the operation of the transmission transistor TX, such that the photocharges 425 accumulated in the photoelectric conversion layer 420 can be transferred to the floating diffusion region 440. When the transmission transistor TX is turned on, the channel may be formed adjacent to dielectric regions 452, 454 and 456 located on sides of the silicon region 470. For the formation of such a channel, the silicon region 470 may include a first conductive-type (for example, p-type) impurity.

The silicon region 470 may be surrounded by the gate dielectric layer 450. Although not illustrated, in a plan view, the gate dielectric layer 450 may have a ring shape to surround at least a part or all of the silicon region 470.

The silicon region 470 may include first to third doping regions 472, 474 and 476. The first to third doping regions 472, 474 and 476 may be doped with impurities having different doping concentrations, and have doping concentrations that decrease, for example, in a stepwise manner, from the first doping region 472 toward the third doping region 476, which makes it possible to improve the lag characteristics of the transmission transistor TX.

The gate dielectric layer 450 may electrically isolate the gate electrode 460 from the substrate 410, the pinning layer 430 and the silicon region 470. The gate dielectric layer 450 may include first to fourth dielectric regions 452, 454, 456 and 458.

The first to third dielectric regions 452, 454 and 456 may be stacked between the pinning layer 430 and the floating diffusion region 440, and have different thicknesses. In the implementation as shown in FIG. 4, the first to third dielectric regions 452, 454 and 456 and the floating diffusion region 440 may be disposed in a vertical direction perpendicular to a surface of the substrate 410.

The first dielectric region 452 may overlap the first doping region 472, and have a fourth thickness T4. The second dielectric region 454 may overlap the second doping region 474, and have a fifth thickness T5 larger than the fourth thickness T4. The third dielectric region 456 may overlap the third doping region 476, and have a sixth thickness T6 larger than the fifth thickness T5. Therefore, the width of the silicon region 470 may decrease from the first doping region 472 toward the third doping region 476.

The gate electrode 460 configured to receive one transmission signal TG may be disposed to abut on side surfaces of the first to third dielectric regions 452, 454 and 456. The silicon region 470 is disposed to be surrounded by the first to third dielectric regions 452, 454 and 456, and the influence of the voltage applied to the gate electrode 460 may increase as the corresponding dielectric region has a smaller thickness.

The fourth dielectric region 458 may be disposed between the gate electrode 460 and the pinning layer 430, and have the same fourth thickness as the first dielectric region 452. However, other implementations are also possible.

In the photocharge accumulation period, the gate electrode 460 may receive the transmission signal TG having a first voltage. The first voltage may correspond to an inactive voltage that turns off the transmission transistor TX. For example, the first voltage may be a negative voltage.

When the first voltage is applied to the gate electrode 460, holes within the pinning layer 430 may be accumulated (or pinned) around the boundary between the pinning layer 430 and the gate dielectric layer 450, thereby reducing a dark current.

The floating diffusion region 440 may receive a positive bias voltage to raise the potential of the floating diffusion region 440 such that the photocharges 425 of the photoelectric conversion layer 420 do not migrate to the floating diffusion region 440 in the photocharge accumulation period.

In the photocharge transmission period, the gate electrode 460 may receive the transmission signal TG having a second voltage. The second voltage may correspond to an active voltage that turns on the transmission transistor TX. For example, the second voltage may be a positive voltage.

When the second voltage is applied to the gate electrode 460, the photocharges 425 accumulated in the photoelectric conversion layer 420 may be drawn upward to the pinning layer 430 and pass through the pinning layer 430. Then, the photocharges 425 may migrate to the floating diffusion region 440 through the channel of the transmission transistor TX formed in the silicon region 470 inside the gate dielectric layer 450.

The floating diffusion region 440 may receive a negative bias voltage in order to lower the potential of the floating diffusion region 440 such that the photocharges 425 of the photoelectric conversion layer 420 can smoothly migrate to the floating diffusion region 440 in the photocharge transmission period.

As described above, the first to third doping regions 472, 474 and 476 may have doping concentrations that decrease in a stepwise manner, in order to improve the lag characteristic of the transmission transistor TX. Thus, the first to third doping regions 472, 474 and 476 may have potentials that decrease in a stepwise manner. At this time, the first doping region 472 having a relatively high doping concentration may have a higher potential than the photoelectric conversion layer 420 and the pinning layer 430, thereby forming a potential pocket to interrupt smooth migration of the photocharges 425 from the photoelectric conversion layer 420 to the first doping region 472. In accordance with the embodiment, however, the first dielectric region 452 having the fourth thickness T4 smaller than the sixth thickness T6 may be disposed on the side surface of the first doping region 472, such that the influence of the voltage of the gate electrode 460 increases. Thus, the potential of the first doping region 472 may be lowered to remove the potential pocket. Furthermore, in order to prevent a potential pocket from being formed between the second doping region 474 and the first doping region 472 having a potential lowered by the first dielectric region 452 having the fourth thickness T4, the second dielectric region 454 having the fifth thickness T5 smaller than the sixth thickness T6 may be disposed on the side surface of the second doping region 474, thereby lowering the potential of the second doping region 474. Furthermore, the fifth thickness T5 may be set to a larger value than the fourth thickness T4, such that no potential pocket is formed between the third doping region 476 and the second doping region 474 having the potential lowered by the second dielectric region 454 having the fifth thickness T5. That is, the fourth to sixth thicknesses T4 to T6 may be experimentally decided not to degrade the lag characteristics of the transmission transistor TX while preventing a potential pocket from being formed in the migration path of the photocharges 425.

In accordance with an embodiment, the silicon region 470 overlapping the gate of the transmission transistor TX may be formed to have a doping concentration that decreases, for example, in a stepwise manner, toward the floating diffusion region 440, and the gate dielectric layer whose thickness is increased, for example, in a stepwise manner, toward the floating diffusion region 440 so as to correspond to the concentration of the silicon region 470 may be disposed to improve the photocharge transmission efficiency.

The gate electrode 460 may receive the transmission signal TG, and control the potentials of the bottom and side regions of the gate dielectric layer 450. The gate electrode 460 may be a polysilicon electrode or metal electrode, but other implementations are also possible.

Figure 5:
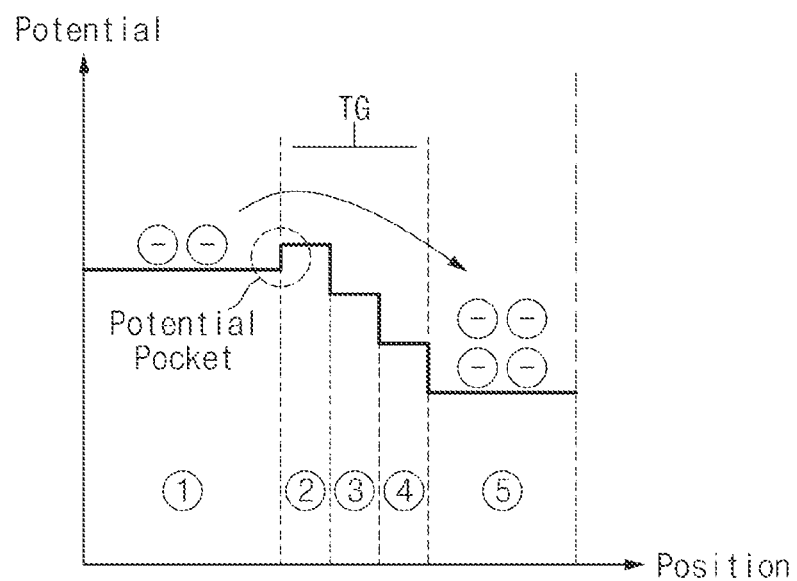
FIG. 5 is a graph illustrating potential distribution in a photocharge transmission period in a comparative example.
Figure 6:
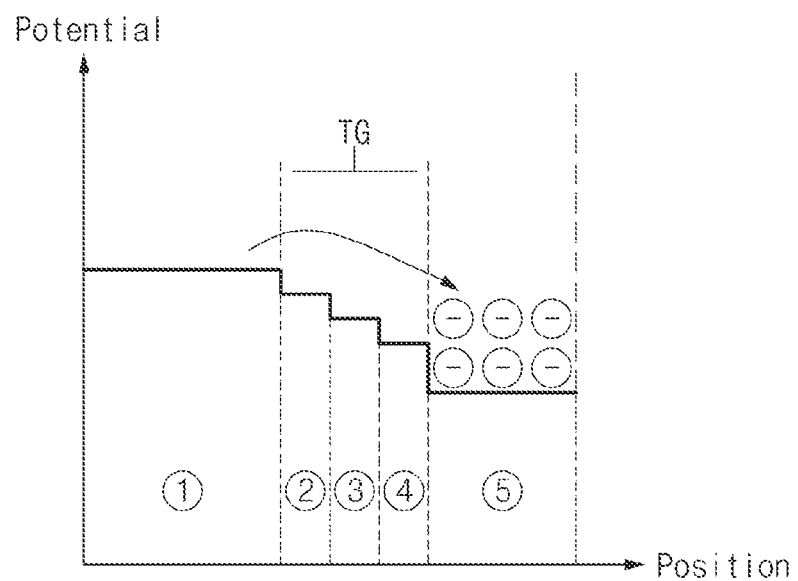
FIG. 6 is a graph illustrating potential distribution in a photocharge transmission period in an embodiment of the disclosed technology.

FIG. 5 is a graph illustrating a potential distribution during a photocharge transmission period when a gate dielectric layer 350 or 450 as shown in FIG. 3 or 4 has a uniform thickness (for example T3 or T6) (hereinafter, comparative example). FIG. 6 is a graph illustrating a potential distribution during a photocharge transmission period when a gate dielectric layer 350 or 450 has a varying thickness based on the implementations as shown in FIG. 3 or 4.

First to fifth regions ① to ⑤ illustrated in FIG. 5 may correspond to the first to fifth regions ① to ⑤ illustrated in FIGS. 3 and 4. Thus, the first region ① may correspond to the photoelectric conversion layer 320 or 420, the second region ② may correspond to the region 332 or 472 having a relatively high doping concentration, the third region ③ may correspond to the region 334 or 474 having an intermediate doping concentration, the fourth region ④ may correspond to the region 336 or 476 having a relatively low doping concentration, and the fifth region ⑤ may correspond to the floating diffusion region 340 or 440.

The potential distribution illustrated in FIG. 5 may correspond to the case in which the transmission signal TG applied to the transmission transistor TX has an active voltage. Thus, according to the transmission signal TG having an active voltage, the photocharges accumulated in the first region ① may be transferred to the fifth region ⑤ through the second to fourth regions ② to ④.

In order to improve lag characteristic of the transmission transistor TX, the second to fourth regions ② to ④ may have doping concentrations that decrease in a stepwise manner, and thus have potentials that decrease in a stepwise manner.

In the comparative example, since the second region ② having a relatively high doping concentration may have a higher potential than the potential of the first region ①, a potential pocket may be formed to interrupt smooth migration of the photocharges from the first region ① to the second region ②. Due to the potential pocket, some photocharges may remain in the first region ①, thereby generating noise in a pixel signal.

FIG. 6 illustrates potential distribution of the photocharge transmission period, which corresponds to the case in which the gate dielectric layer 350 or 450 has a thickness that increases, for example, in a stepwise manner, in the migration direction of the photocharges as in the embodiment of FIG. 3 or 4.

The dielectric region 352 or 452 having a relatively small thickness may be disposed to overlap the second region ②, such that the influence of the voltage of the gate electrode 360 or 460 increases. Thus, the potential of the second region ② may be lowered to remove a potential pocket. Furthermore, the thickness of the dielectric region 354 or 454 which overlaps the third region ③ to have a potential that decreases in a stepwise manner from the second region ② toward the fourth region ④ may be adjusted to improve the lag characteristic of the transmission transistor TX.

The control signals (e.g. the transmission signal TG, the pixel reset signal RG, the row selection signal SEL, the positive or negative bias voltage, etc.) supplied to the pixels described in FIGS. 2 to 6 are generated by the row driver 120 based on the control of the timing controller 170.

While various embodiments have been described above, variations of the described embodiments and other embodiments can be made based on what is disclosed/illustrated in this patent document.

What is claimed is:

1. An image sensing device, comprising:
  a substrate including a photoelectric conversion layer configured to respond to incident light to generate photocharges corresponding to an intensity of the incident light;
  a plurality of doping regions disposed along a migration path of the photocharges and doped with dopants in different doping concentrations; and
  a gate dielectric layer disposed over the substrate and having a gate dielectric layer portion overlapping the plurality of doping regions, the gate dielectric layer portion having a varying thickness that increases along the migration path of the photocharges.

2. The image sensing device of claim 1, wherein the plurality of doping regions comprise a first doping region, a second doping region and a third doping region that are disposed along the migration path of the photocharges, and
  the gate dielectric layer comprises a first dielectric region overlapping the first doping region, a second dielectric region overlapping the second doping region, and a third dielectric region overlapping the third doping region.

3. The image sensing device of claim 2, wherein the first dielectric region has a first thickness smaller than that of the second dielectric region, and
  the second dielectric region has a second thickness smaller than that of the third dielectric region.

4. The image sensing device of claim 2, wherein the first doping region has a first doping concentration higher than that of the second doping region, and
  the second doping region has a second doping concentration higher than that of the third doping region.

5. The image sensing device of claim 2, further comprising a gate electrode configured to receive a transmission signal for transmitting the photocharges to a floating diffusion region to accumulate the photocharges,
  wherein the first to third dielectric regions abut on the gate electrode.

6. The image sensing device of claim 5, wherein the transmission signal provided to the gate electrode has a negative voltage to turn off a transmission transistor during a photocharge accumulation period in which the photoelectric conversion layer generates and accumulates the photocharges.

7. The image sensing device of claim 5, wherein the transmission signal provided to the gate electrode has a positive voltage to turn on a transmission transistor during a photocharge transmission period in which the photocharges are transmitted from the photoelectric conversion layer to the floating diffusion region.

8. The image sensing device of claim 2, wherein the first to third doping regions are included in a pinning layer disposed between the photoelectric conversion layer and one surface of the substrate.

9. The image sensing device of claim 8, wherein the pinning layer has an area corresponding to the photoelectric conversion layer.

10. The image sensing device of claim 8, wherein the pinning layer further comprises a fourth doping region not overlapping with the gate dielectric layer, and
  the fourth doping region has a higher doping concentration than the first doping region.

11. The image sensing device of claim 8, wherein the third doping region has a higher doping concentration than the substrate.

12. The image sensing device of claim 2, wherein the first to third doping regions are included in a silicon region disposed between the photoelectric conversion layer and a floating diffusion region spaced by a predetermined distance apart from one surface of the substrate.

13. The image sensing device of claim 12, wherein the silicon region is surrounded by the gate dielectric layer.

14. The image sensing device of claim 12, wherein the silicon region has a width that decreases from the first doping region toward the third doping region.

15. The image sensing device of claim 12, wherein the floating diffusion region is configured to receive a positive bias voltage such that the photocharges do not migrate to the floating diffusion region during a photocharge accumulation period in which the photoelectric conversion layer generates and accumulates the photocharges.

16. The image sensing device of claim 12, wherein the floating diffusion region is configured to receive a negative bias voltage such that the photocharges smoothly migrate to the floating diffusion region during a photocharge transmission period in which the photocharges are transmitted from the photoelectric conversion layer to the floating diffusion region.

17. An image sensing device, comprising:
  a first region disposed in a substrate and configured to generate photocharges in response to incident light;
  a second region and a third region that are disposed along a migration path of the photocharges and have doping concentrations that decrease along the migration path of the photocharges;
  a fourth region disposed to accumulate the photocharges transferred through the second region and the third region; and
  a gate dielectric layer having a portion overlapping with the second region and the third region, the portion of the gate dielectric layer having a thickness that increases along the migration path of the photocharges.

18. The image sensing device of claim 17, wherein the first and second regions are structured and connected such that the first region has a higher potential than a potential of the second region in a photocharge transmission period in which the photocharges are transmitted from the photoelectric conversion region to the floating diffusion region.

19. The image sensing device of claim 17, wherein the second region, the third region and the fourth region are disposed along a direction parallel to a surface of the substrate.

20. The image sensing device of claim 17, wherein the second region, the third region and the fourth region are disposed along a direction perpendicular to a surface of the substrate.

* * * * *